United States Patent
Tzeng et al.

(10) Patent No.: US 6,958,249 B1
(45) Date of Patent: Oct. 25, 2005

(54) METHOD TO MONITOR PROCESS CHARGING EFFECT

(75) Inventors: Jiann-Tyng Tzeng, Yi-Lan (TW); Yuh-Hwa Chang, Taipei Hsieh (TW); Jiun-Nan Chen, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/074,881

(22) Filed: Feb. 12, 2002

(51) Int. Cl.⁷ ............................................. H01L 21/66
(52) U.S. Cl. .............................. 438/18; 438/11; 438/17
(58) Field of Search .................... 438/11, 17, 18, 438/705.101, 705.102, 705.142

(56) References Cited

U.S. PATENT DOCUMENTS

| | | | |
|---|---|---|---|
| 4,807,994 A | * | 2/1989 | Felch et al. .................. 356/326 |
| 5,861,634 A | | 1/1999 | Hsu et al. ...................... 257/48 |
| 5,907,764 A | | 5/1999 | Lowell et al. ................. 438/17 |
| 5,913,102 A | * | 6/1999 | Yang ............................. 438/14 |
| 5,940,682 A | * | 8/1999 | Tabara .......................... 438/17 |
| 6,060,329 A | | 5/2000 | Kamata et al. ................. 438/9 |
| 6,077,740 A | * | 6/2000 | Jeng et al. .................. 438/248 |
| 6,143,579 A | | 11/2000 | Chang et al. ................. 438/17 |
| 6,232,134 B1 | | 5/2001 | Farber et al. .................. 438/9 |
| 6,265,729 B1 | * | 7/2001 | Nelson et al. ................ 257/48 |

FOREIGN PATENT DOCUMENTS

| | | | | | |
|---|---|---|---|---|---|
| JP | 63153863 A | * | 6/1988 | ........... H01L 29/78 |
| JP | 07202018 A | * | 8/1995 | ....... H01L 21/8242 |

* cited by examiner

*Primary Examiner*—Tom Thomas
*Assistant Examiner*—N. Drew Richards

(57) ABSTRACT

A new method is provided for monitoring the effect of electron charging during the creation of a semiconductor device. The method of the invention makes use of electron trapping that occurs as a result of FN tunneling in a layer of interlayer oxide of an EEPROM device. The electron trapping is monitored under conditions of processing. After the electron trapping has occurred, the rate of discharge of the trapped electron charge is measured during Wafer Acceptance Testing (WAT).

17 Claims, 4 Drawing Sheets

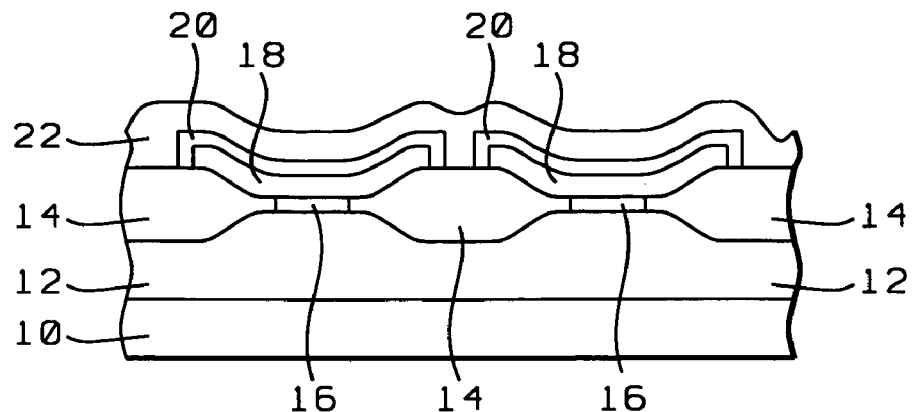
*FIG. 1 — Prior Art*
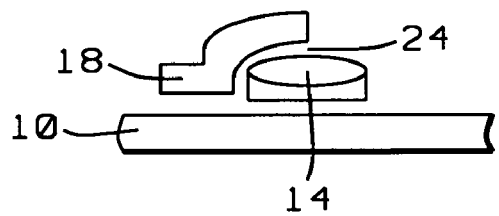
*FIG. 2 — Prior Art*
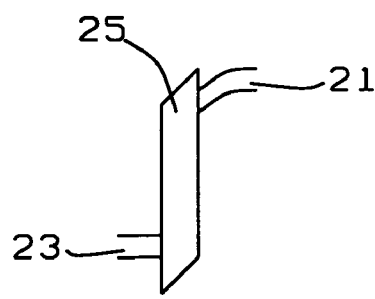
*FIG. 3 — Prior Art*

METHOD TO MONITOR PROCESS CHARGING EFFECT

BACKGROUND OF THE INVENTION (1) Field of the Invention

The invention relates to the fabrication of integrated circuit devices, and more particularly, to a method to monitor radiation induced charging effect during the creation of semiconductor devices.

(2) Description of the Prior Art

During the creation of semiconductor devices, layers of semiconductor material are patterned and shaped to form separate elements of the devices. This patterning and shaping of the layers of semiconductor material typically requires the radiation of these layers by sources of high energy, whereby the energy that is imparted to the exposed layer determines the change that is affected in the exposed layer. Examples of such radiation are impurity implants that are performed in for instance the surface of a substrate in order to created regions of different conductivity in the exposed regions of the substrate. Well-known device features such as p-well and n-well impurities and the creation of Field Effect Transistor related source/drain implants fall into this category of impurity implants. Another example is the frequently applied processing step of plasma etching, whereby a top layer of a layer of semiconductor material, such as the surface of a silicon substrate, is selectively removed by a high-energy plasma that controllably erodes and therewith removes the upper layer of the layer of semiconductor material.

A key component of these methods of exposure is the use of electrical charges, of various compositions and densities and energy content, that are used for various objectives of which two have been highlighted above. As a side effect of the controlled process, electrical charges can be expected to accumulate in non-conductive or semi-conductive elements of the device that is being created. These electrical charges can be trapped between for instance layers of insulating material. Continued accumulation of the electrical charges may result in creating an electromagnetic field in the region that is being charged of a magnitude large enough that molecular and structural damage may result in the accumulating layer.

It is therefore required, in order to avoid damage to elements that form part of a semiconductor device, that the accumulated electrical charges are monitored. This requirement that is especially valid for elements of a device that are most prone to incur damage or that are most likely to accumulate electrical charges during the process of creating a semiconductor device. As an example of an element that is most likely to be damaged by the occurrence of electrical charges of the type that have just been highlighted can be cited a layer of gate oxide that is typically created under the gate electrode of a Metal Oxide Silicon FET (MOSFET) since this layer is required to be very thin (about 100 Angstrom) for reasons of device performance requirements. The MOSFET device is typically interconnected to surrounding devices by creating metal interconnects to the gate structure and to the source/drain regions of the device. With the metal interconnect to the gate electrode in place, interconnects are established to the surface of the source/drain regions of the device. The metal interconnect to the gate electrode is prone to act as a collector of electric charges during the plasma etch that is required to create openings through an insulating layer of material in order to create the metal interconnects to the source/drain regions. The charge that accumulates on the gate electrode metal creates a high electrical potential between the gate electrode and the underlying silicon substrate, that is across the layer of gate oxide of the structure, raising the potential of damage to this layer of gate oxide, which is required to be very thin.

These and other negative effects of the accumulation of electrical charges during the creation of a semiconductor device must by understood and monitored. The invention provides such a method, which is simple to implement and cost effective to use.

U.S. Pat. No. 5,907,764 (Lowell et al.) shows a charge monitor and process.

U.S. Pat. No. 6,232,134 (Farber et al.) reveals a wafer charge monitoring method.

U.S. Pat. No. 6,060,329 (Kamata et al.), U.S. Pat. No. 5,861,634 (Hsu et al.) and U.S. Pat. No. 6,143,579 (Chang et al.) show related processes.

SUMMARY OF THE INVENTION

A principle objective of the invention is to provide a simple and effective method for monitoring the effect of electron charging during the creation of a semiconductor device.

In accordance with the Objectives of the invention a new method is provided for monitoring the effect of electron charging during the creation of a semiconductor device. The method of the invention makes use of electron trapping that occurs as a result of FN tunneling in a layer of interlayer oxide of an EPROM device. The electron trapping is monitored under conditions of processing. After the electron trapping has occurred, the rate of charge trapped in interlayer oxide is measured during Wafer Acceptance Testing (WAT).

BRIEF DESCRIPTION OF THE DRAWINGS

FIG. 1 show a cross section of a conventional NAND type EEPROM cell.

FIG. 2 shows a subsection of the cross section of FIG. 1

FIG. 3 a three dimensional view for explaining the electron charging effect.

FIG. 4 shows the cross section of the surface of a substrate over which a layer of silicon nitride has been deposited.

FIG. 5 shows a cross section after a photoresist mask has been created over the surface of the layer of silicon nitride.

FIG. 6 shows a cross section after the layer of silicon nitride has been etched in accordance with the photoresist mask, the photoresist mask has been removed.

FIG. 7 shows a cross section after regions of field isolation have been created in the surface of the substrate in accordance with the silicon nitride mask.

FIG. 8 shows a cross section after the surface of the substrate has been etched, creating trenches in the substrate between the silicon nitride mask.

FIG. 9 shows a cross section after a layer of HTO or of dry oxide or of wet oxide is created over the surface of the structure followed by the deposition of a layer of polysilicon.

FIG. 10 shows a cross section after the layer of polysilicon has been patterned and etched.

DESCRIPTION OF THE PREFERRED EMBODIMENTS

Figure 4:
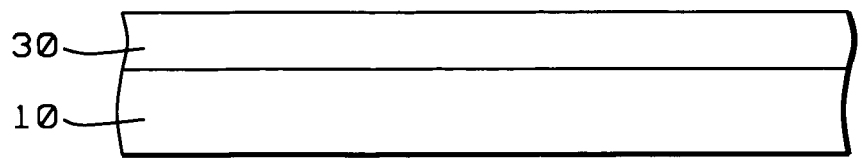
FIGS. 4 through 10 show the creation of the monitoring device of the invention, as follows.

For a further understanding of the invention, basic concepts of EPROM device creation and the FN tunneling effect are first reviewed.

Referring for this purpose first to the cross section that is shown in FIG. 1, this cross section represents a conventional prior art NAND type EEPROM cell comprising the following elements:

10, an n-type substrate over the surface of which the EPROM cell has been created 12, a p-type impurity implant performed into the surface of substrate 10

14, field isolation regions that electrically isolate adjacent gate structures and that typically are formed using LOCOS techniques 16, layers of gate dielectric formed underneath the gate electrodes of the structure, tunneling current flows through these layers of gate dielectric during operation of the EERPROM cell 18, the floating gates of the EEPROM cell 20, a layer of insulating film that is created over the surface of the floating gates 18

22, the control gate of the EEPROM cell.

As a first step in the creation of the EPROM device, a layer (not shown) of sacrificial silicon oxide is grown on the surface of the n-type substrate to clean the edge of the field oxide regions 14, that is to remove or limit the extend of the "bird's beak" (regions of field oxide that laterally extend from the body of the field oxide region) that is typically part of the field oxide regions.

The layer of sacrificial silicon oxide is then stripped before growth of the tunnel oxide (layer 16) in the active regions of the surface of the substrate. The thin layer 16 of tunnel oxide is formed over the exposed surface of the substrate 10 including the surface of the field oxide layers 14.

A layer of polysilicon (poly 1) is deposited over the surface of the layer 16 of gate oxide, this layer of poly 1 is selectively etched and forms the layers 18 that function as the floating gates of the EPROM device.

A layer 20, of for instance inter-polysilicon ONO, is deposited over the surface of the floating gates 18. The gate structure of the EPROM devices is completed by the overlying layer 22 of poly 2, which forms the control gate that runs in an X-direction of the memory array interconnecting a plurality of control gates in that direction.

The self-aligned floating gates 18 are formed at the same time by selective etching. A p-type implant is performed into the surface of the substrate 10 forming the p-type source regions (not shown) in the surface of the substrate 10. The p-type implanted ions can be further driven into the surface of the substrate to make the source regions deep regions. Ion implants of p-type are performed into the substrate to form (shallower) p-type doped drain regions (not shown).

The structure of the cross section that is shown in FIG. 1 can be further completed by depositing an insulating layer over the structure that also covers the gate control strips electrode 22. Openings are made in this layer of insulation above the drain regions.

Electrical contact is established with the drain regions of the structure by means of a plurality of metal strips that are created in the Y-direction. The source region is contacted (not shown) by metal lines that have been extended in the X-region of the array. A coating of insulation is deposited to overly the metal strips that are created in the Y-direction in order to establish contact with the drain regions of the structure.

For the EPROM cells that have been created in accordance with FIG. 1, when the drain region and the control strips are kept at a high voltage while the source region is kept at a low or ground voltage, hot electrons that are created in the channel region between the source and drain regions are injected into the floating gate. A "0" value is therefore stored in the memory cell. When the voltage that is applied is reversed, the electrons that have accumulated in the memory cell are discharged resulting in a "1" being stored in the memory cell.

Keeping the basic review of a conventional EPROM device in mind, the principle on which the invention is based is next explained using FIGS. 2 and 3.

Shown in FIG. 2 is a subsection of the previously detailed cross section of FIG. 1. This subsection of FIG. 2 specifically concentrates on the layer 20 of interpoly insulation and the thereto-adjacent layers of poly 1 and poly 2. In this layer of insulation, typically containing interpoly insulating material, a FN tunneling effect takes place, which is specifically stimulated during a FN tunneling stress phase of the invention. The FN tunneling effect is typical of a thin layer of oxide that is placed under stress by an electromagnetic field that is introduced between essentially parallel surfaces of the thin layer of oxide. Fowler-Nordheim or FN tunneling occurs in layers of oxide across which an electromagnetic field in excess of 10 mV/cm occurs. In view of the extremely small thickness of the interpoly layer 20, FIG. 1, a voltage of 10 volts or more will result in FN tunneling in layer 20. To relate this to the gate electrode structure that has been highlighted in FIG. 1, a charge on the poly 2 (layer 22, FIG. 1) of the control gate of the EPROM device, that is created by the electron charging effect that occurs during the creation of a semiconductor device, of 10 volts or more initiates FN tunneling through the layer 20 of interpoly insulation. It is not uncommon the encounter such voltages of 10 volts or more, specifically during the plasma etch that is required to create openings to the source/drain regions of the gate electrode. Excessive FN tunneling is undesirable since it leads to the occurrence of positively charged ions traps in the interface layer 20 which ultimately may lead to breakdown of this layer and to the therefrom following concerns of device reliability.

The degree to which FN funneling takes place in interface layer 20 is in direct relation with the voltage that has been accumulated on the layer 22 of poly 2. During FN stress test, the FN tunneling can be further stimulated. For voltages that have been accumulated on layer 22 of poly 2 that are relatively low, a significant amount of stimulation is required in order to initiate the FN tunneling phenomenon. The degree of stimulation that is required before the stimulation of the stress test results in FN tunneling is therefore indicative of the amount of charge that has been accumulated in the layer 22 of poly 2 (the accumulated voltage).

Returning to FIG. 2, there is shown a surface 10 of a silicon substrate over which a layer 14 of field isolation oxide has been created, a layer 18 of poly 1 overlies the layer 14 of field oxide. Layer 24 forms an interface layer between the layer 14 of field oxide and the layer 18 of poly 1, this layer will be further highlighted at a later time. In accordance with the above highlighted FN tunneling effect, tunneling will occur in layer 24 if this layer has a thickness of 100 Angstrom or less and if a voltage of 10 volts or more exists across the thickness of layer 24.

A similar effect is highlighted in the three dimensional view that is shown in FIG. 3 as follows: layer 21 is a layer of poly 1, layer 23 is a layer of poly 2, a very small layer of insulation and the like is represented with plane 25. Under conditions of distance between adjacent layers 21 and 23 and voltage being present across this distance that have been highlighted above, tunneling will occur in plane 25.

For prior art applications that are aimed at measuring the electron charge that is incurred during the processing of semiconductor devices, a large metal area is created over a substrate in combination with a gate electrode. This large metal surface collects the electron charge since it functions as an antenna of large size. The large antenna is connected to the gate electrode, influencing the electrical characteristics of the gate electrode. By then reading the threshold voltage of the gate electrode, the amount of charging that has taken place can be determined.

The process that is followed by the invention to create a structure over the surface of a control wafer that is used to monitor the electron charge phenomenon is described next. It must thereby kept in mind that the monitoring approach of the invention uses the steps of:

1. expose the monitoring wafer to process conditions such as conditions of plasma etch or a clean process
2. perform a wafer acceptance test of accumulated electron charge on the monitoring wafer to determine if electron charging effect of the process is normal and within acceptable limits or not, and
3. perform a high-temperature anneal of the monitoring wafer which makes the monitor wafer available for further use.

The monitoring wafer starts with an n-type substrate over the surface of which first regions of field isolation are created.

It is well known in the art that in order to create high-performance semiconductor devices, these devices are being formed in or on the surface of a substrate using increasingly higher device densities and smaller feature sizes.

Continuing device shrinkage and increased device density present new problems in the creation of the devices. One such problem is the necessity of building an efficient and reliable process to separate active devices that function on the current miniaturized scale.

One method previously used is termed Local Oxidation of Silicon (LOCOS) process. The LOCOS process involves the use of a temporary patterned nitride layer, which is used as a protection or resistant area to cover the future active areas during the subsequent field oxidation process in forming CMOS gate structures. LOCOS is a non-planarized isolation technology in which a trench is etched into the electrically active silicon and filled with oxide.

The LOCOS process creates an oxidation resist layer, generally silicon nitride, over the locations of the surface of the chip into which the active devices are to be formed, that is the active regions. The layer of silicon nitride is deposited over a layer of pad oxide overlying a silicon substrate. The nitride and oxide layers are etched to leave openings exposing portions of the silicon substrate where the local oxidation will take place. The wafer is then placed in an oxidation environment, generally in steam at a high temperature such as 1,100 degrees C. The portions of the wafer not covered by the oxidation barrier oxidize to form thermal silicon thereat, with oxidation masked from the active regions by the oxidation barrier. LOCOS field oxide is generally formed to a sufficient thickness such that a conductor placed thereover will not convert the channel thereunder when biased to the maximum circuit voltage. Optionally, a boron channel-stop layer is ion implanted into the isolation regions.

One requirement of using nitride layers with CMOS processes, such as the LOCOS process, is that the nitride layers must be patterned early in the process in preparation for field oxidation with little or no critical dimension bias. Critical dimension bias is defined as the difference in a feature measurement before and after a process flow step, such as comparing the dimension of a feature before being etched and after the etch is completed.

The invention uses an area of the monitoring wafer that is referred to as silicon tip as a point discharge path for monitoring the electron charge effect. The silicon tip is created using a LOCOS-like process after which the created LOCOS surface regions are used as a hard mask for etching the exposed surface of the silicon substrate. Layers of HTO and polysilicon are then deposited to serve as layers of interlayer oxide and as an upper electrode. The invention can be extended by applying different antenna configurations, which result in different antenna ratio to electron charging effect. Electron trapping occurs in the interlayer oxide during conditions of FN tunneling stress, electron trap-out rate after the FN tunneling stress can be measured, indicating the amount of electron charging that has taken place in the monitoring wafer.

High Temperature Oxide (HTO) is the silicon dioxide that is deposited during conditions of higher temperature.

The creation of the electron charge-monitoring wafer is now described in detail using FIGS. 4 through 10 for this purpose.

The cross section that is shown in FIG. 4 shows the surface of a substrate 10, n-type impurity has been implanted into the surface of substrate 10. Deposited over the substrate has been a layer 30 of silicon nitride, the previously mentioned layer of oxide has not been shown in the cross section of FIG. 4 since this layer is not of critical importance to the invention.

The layer 30 of silicon nitride ($Si_3N_4$) can be deposited using LPCVD or PECVD procedures at a pressure between about 300 mTorr and 400 mTorr, at a temperature between about 600 and 800 degrees C., to a thickness of about 2,500 Angstrom using $NH_3$ and $SiH_4$ as source material. The silicon nitride layer 30 can also be deposited using LPCVD or PECVD procedures using a reactant gas mixture such as dichlorosilane ($SiCl_2H_2$) and amonia ($NH_3$).

Figure 5:
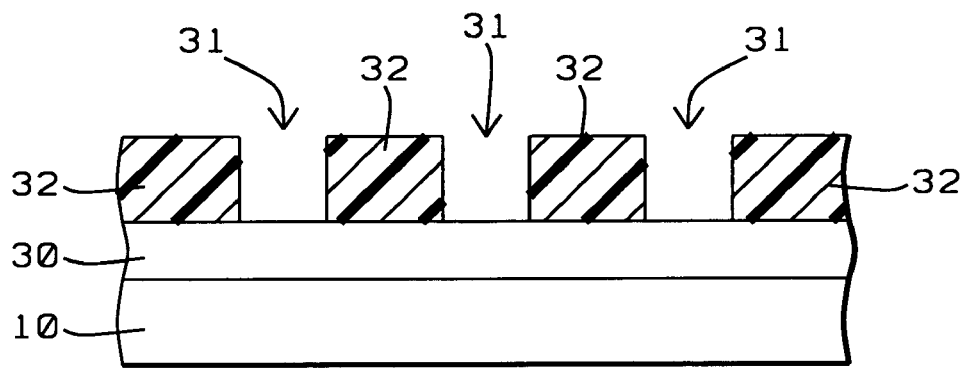
Figure 6:
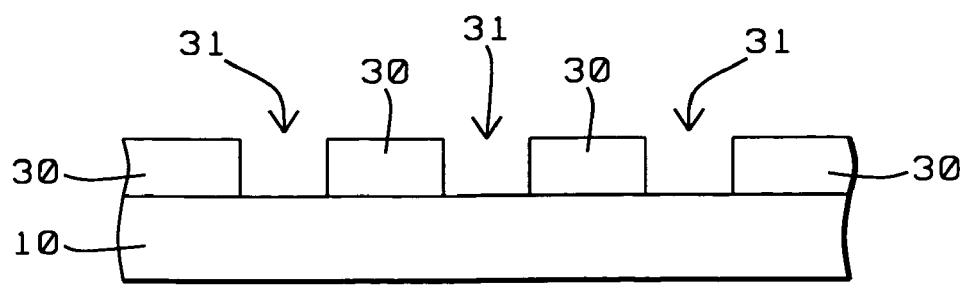
Figure 7:
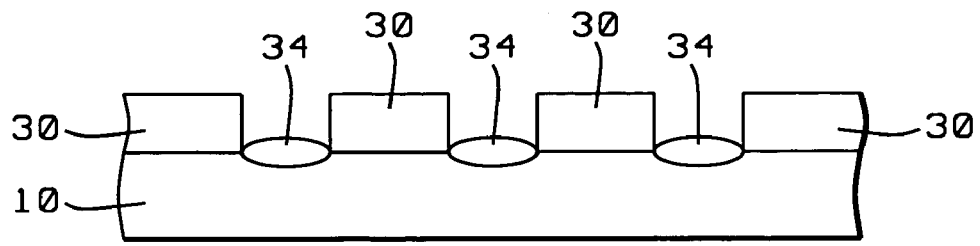

The cross section that is shown in FIG. 5 shows a mask 32 of photoresist that has been created over the surface of layer 30 of silicon nitride in preparation for the etch of layer 30. The pattern of openings 31 aligns with the pattern of field isolation regions that must be created in the surface of substrate 10.

The deposition and developing of the layer 32 of photoresist uses conventional methods of deposition and photolithography that are well known in the art. Photoresist stripping frequently uses sulfuric acid ($H_2SO_4$) and mixtures of $H_2SO_4$ with other oxidizing agents such as hydrogen peroxide ($H_2O_2$), the same components are frequently used in cleaning a wafer surface after the photoresist has been stripped.

The layer 30 of silicon nitride is then etched in accordance with the pattern provided by openings 31 of the photoresist mask 32, the photoresist mask is then removed from the surface. The results of these processing steps are shown in cross section in FIG. 6, with a patterned and etched layer 30 of silicon nitride remaining in place over the surface of substrate 10.

The preferred method of the invention for the etch of the layer 30 is a dry etch such as applying an RIE etch using $CHF_3$ or $SF_6$—$O_2$ as an etchant. Methods for the removal of photoresist mask 32 have been highlighted previously.

The protective mask 30 is now in place for the oxidation of the surface of substrate 10. The substrate 10 is placed in an oxidation environment, generally in steam at a high temperature such as 1,100 degrees C. The portions of the wafer not covered by mask 30 of silicon nitride oxidizes to form thermal silicon layers 34, FIG. 7.

The mask 30 of silicon nitride is now removed from the surface of the substrate 10 by using the reverse mask than the mask that has been used for the creation of the silicon nitride mask 30 and by applying previously indicated methods and procedures of silicon nitride etch. The results of the removal of the mask 30 of silicon nitride is partially shown in the cross section of FIG. 8.

Figure 8:
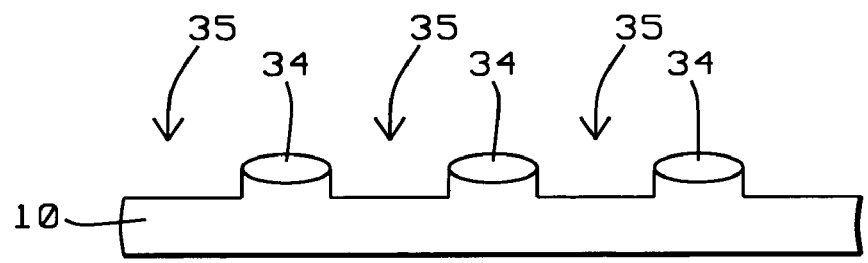

It must at this time be noted that the regions 34 of field oxide in turn form a mask, this mask is next used for etching the surface of the substrate 10 such that a measurable amount of silicon is removed from the surface as shown in the cross section of FIG. 8. The substrate 10 can be etched using a wet etchant, such as a wet etchant of a monocrystalline silicon surface by a solution containing a mixture of KOH (potassium hydroxide) and $H_2O$. This solution anisotropically etches the silicon substrate 10, forming grooves 35. It must thereby be realized that grooves 35 may have sidewalls that are sloped at an angle with the horizontal. The slope of the sidewalls is a function of the different etch rates of monocrystalline silicon along the different crystalline orientations. The surface of the substrate represents <100> planes of the silicon, which etches faster than the sloped sidewalls that represent the <111> plane. The etch of substrate 10 must therefore be performed such that the sidewalls of grooves 35 are essentially perpendicular to the surface of the substrate 10. The etch of substrate 10 is time mode controlled and uses, as previously pointed out, the pattern of field isolation regions 34 in the surface of the substrate 10 as a hard mask.

Figure 9:
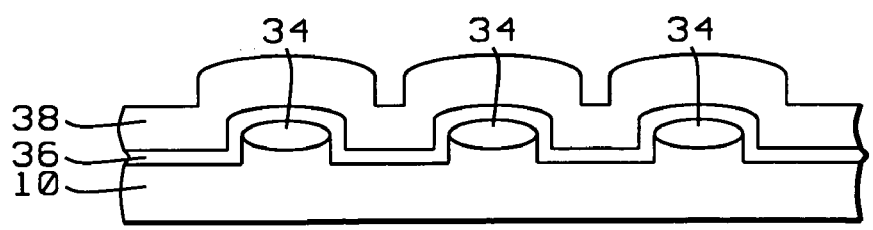

Next, FIG. 9, a layer 36 of HTO or of dry oxide or of wet oxide is created over the surface of the structure followed by the deposition of a layer 38 of polysilicon. Layer 36 is preferably created to a thickness between about 80 and 300 Angstrom.

The layer 38 of polysilicon can be deposited using conventional methods such as using low-pressure vapor deposition (LPCVD) using, for example, silane ($SiH_4$). The preferred thickness of polysilicon layer 38 of the invention is between 1,500 and 6,000 Angstrom.

Figure 10:
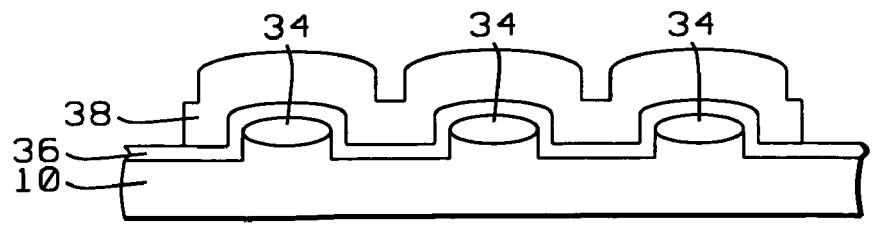

As a final step, the layer 38 of polysilicon is etched and annealed, creation the structure that is shown in cross section in FIG. 10. Layer 38 of polysilicon can be etched using anisotropic etching with an etchant gas of one of the group of $CF_4$, $CHF_3$, $CHCl_3$, $CCl_4$, $BCl_4$ and $Cl_2$ at a temperature between about 100 and 200 degrees C.

The cross section that is shown in FIG. 10 now provides a ready means for evaluating the level of electron charge that occurs in a processing environment. By exposing the surface of the substrate that is shown in cross section in FIG. 10 to a processing environment in the same physical location and under the same processing conditions that are applied during the actual process that is being evaluated for the degree of electron charge that is introduced by this process, the FN tunneling effect is allowed to take place in the layer 36. The combined configuration of the three elevated layers of polysilicon are referred to as the tip of an n-type substrate, this tip is, as highlighted, sensitive to the charging effect since a thin layer of oxide interfaces with an overlying layer of polysilicon. Electrons that are stimulated by the FN tunneling effect are trapped in the interlayer 36 of oxide.

The flexibility that is made available by the invention will be realized when it is realized that the pattern that comprises a tip of a substrate can be varied at will and can therefore be selected for optimum methods of monitoring under various conditions of device creation. The layers of LOCOS oxide can be created in any desirable pattern while the thereover created layer of polysilicon can equally be patterned in any desirable manner so that measurements can be performed for the monitoring of the electron charge effect in a large numbers of configurations. Examples of these configurations are shown in the top view of a number of different layouts of LOCOS oxide and the thereover created layer of polysilicon.

Figure 11:
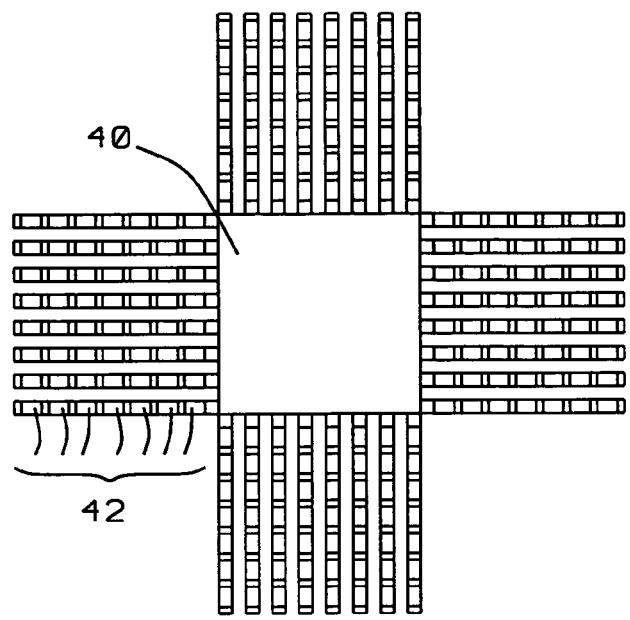
FIGS. 11 and 12a through 12d shows a number of possible configurations of the electric charging monitoring device of the invention.

FIG. 11 shows a top view of a first configuration wherein:
40 is the patterned polysilicon, and
42 are the LOCOS regions.

For the complete surface that is shown in top view in FIG. 11, the layer of polysilicon is the upper layer of dielectric. Areas 42 are the areas of the surface of the substrate over which LOCOS regions have been created, these areas are therefore the areas where the FN tunneling effect takes place and these areas therefore serve as the antenna of the device.

Surface area 40 of polysilicon would typically be the area that is contacted after exposure of the monitoring wafer in order to measure the electron trap out rate. This trap out rate is defined as being the voltage that must be applied between the layer of polysilicon (layer 38, FIG. 10) and the underlying substrate (10, FIG. 10) to induce a 0.1 $\mu$A current between these two surfaces.

It is clear that if for instance a significant amount of electron charge has taken place, resulting in significant accumulation of FN tunneling electrons in layer 36, FIG. 10, then this voltage is relative small since not much electromagnetic stimulation is required in order to reach a current of 0.1 $\mu$A. The inverse is also true.

The definition of the trap out rate, also referred to as the trap up voltage, can also be stated as follows: the amount of FN voltage that is required to induce a FN current of 0.1 $\mu$A, where FN refers to the voltage and current as these units relate to the FN layer 36, FIG. 10.

FIGS. 12a through 12d show four more configurations, using the same numbers for highlighting the LOCOS regions (42) and the patterned polysilicon (40) as have been used in FIG. 11. For these configurations, the areas 42, which are the LOCOS regions, are the "collectors" or antenna of the device. The areas 40, which are the regions of polysilicon, generally serve as the areas that are contacted in order to measure the electron charge effect in accordance with the previously highlighted principles.

Figure 12A:
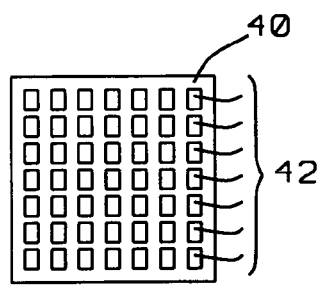
Figure 12B:
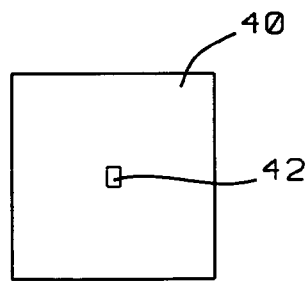
Figure 12C:
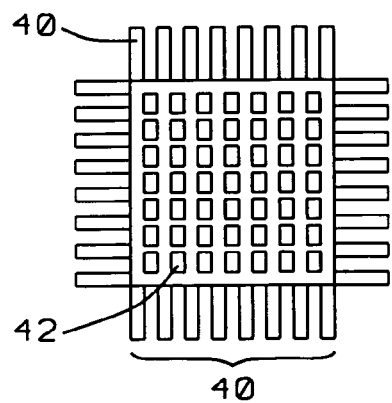
Figure 12D:
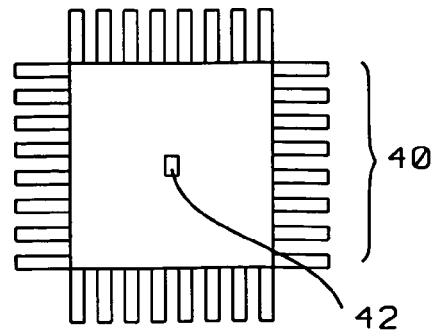

The layer 38 of patterned polysilicon, FIG. 10, is the upper electrode of an arrangement that has similarities with a capacitor, the silicon substrate 10 resembling the lower electrode of this capacitor with the layer 36 resembling the capacitive dielectric. The created device, shown in cross section in FIG. 10 and having polysilicon and LOCOS configurations that are shown in FIGS. 11 through 12d, is, as stated, placed in an environment that is evaluated for the effect of electron charge and is in that environment allowed to develop a charge across the layer 36 of interlayer dielectric due to the FN tunneling effect that takes place in the dielectric layer 36. By therefore measuring the voltage that is required to draw a specific amount of current from this "capacitive component" after this component has been exposed to an operating environment, a measure of FN tunneling and with that a measure of the electric charge effect can be obtained for the operating environment. Specifically, this can be stated as how much FN voltage is required in order to draw a FN current of for instance 0.1 μA between the layer of polysilicon and the underlying surface of the substrate.

The sequence in which the invention can be implemented can be broken down as follows:

1) create a monitor wafer in accordance with the processing steps that have been highlighted using FIGS. 4 through 10, resulting in the structure of FIG. 10 with possible configurations as have been shown in top view in FIGS. 11 through 12*d*

2) expose the created monitor wafer to process conditions that are required to be investigated or monitored for the electron charge effect; these processes can comprise PSC strip/oxide ashing impurity implants of any variety clean process, since a high pressure water jet can induce an electrical charge plasma etching, the exposure here may be of a short duration such that no damage in introduced to the surface of the monitor wafer oxide deposition followed by BOE dip which removes the oxide metal deposition followed by a wet dip or plasma etching to pattern the metal 3) after the exposure of the monitor wafer is terminated, the monitor wafer is measured during Wafer Acceptance Testing (WAT), measuring the trap-up-rate (TUR) which is indicative of the amount of voltage that is required to draw a specific amount of current from the monitor wafer and it therefore indicative of the number of electrons that have been trapped in the layer of interlayer oxide. This TUR is typically used to monitor oxide quality for flash memory products, such as EPROM devices, after passivation etch has been completed for the creation of source/drain contact points.

The monitor wafer, after the above highlighted procedure of monitoring a processing environment has been completed, can be restored to its original condition by applying an anneal at a temperature in excess of 500 degrees C. to the monitor wafer. This anneal releases the trapped electron charge. The monitor wafer can after this be re-used.

The implementation and method of the invention, for monitoring electron charge effect occurring during semiconductor processing, can be summarized as follows:

the invention starts with a substrate, a layer of n-type conductivity has been created in the surface of the substrate a first pattern of Local Oxidation of Silicon (LOCOS) regions is created in the surface of the substrate, the first pattern of LOCOS is interspersed with exposed surface regions of the substrate the exposed surface regions of the substrate are etched, using the first pattern of LOCOS regions as a hard mask, creating a first pattern of elevated LOCOS regions, creating trenches having inside surfaces in the surface of the substrate a layer of interlayer oxide is created over the surface of the first pattern of LOCOS regions and the inside surfaces of the trenches created in the surface of the substrate a layer of polysilicon of deposited over the surface of the layer of interlayer oxide the layer of polysilicon is patterned and etched, creating a second pattern of polysilicon, the surface of the second pattern of polysilicon comprising at least one contact point over the surface of the substrate; this completes the creation of a electron charge monitoring device a semiconductor processing tool is provided, the semiconductor processing tool being designated as being a tool that is evaluated for electron charge effect of a process being performed by the tool the substrate comprising the electron charge monitoring device is positioned inside the processing tool, in a location and a position that is identical with a position and location that is occupied by a substrate that is processed by the tool processing conditions of a process are established, as these processing conditions apply for the process and the tool the surface of the electron charge monitoring device is exposed to the established processing conditions for a period of time having a measurable duration the processing conditions are terminated the electron charge monitoring device is removed from the semiconductor processing tool, and a voltage required to induce a current between the layer of polysilicon and the surface of the substrate is measured.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for monitoring electron charge effect occurring during semiconductor processing, comprising:

providing a substrate, a layer of n-type conductivity having been created in said substrate;

creating a pattern of Local Oxidation of Silicon (LOCOS) regions in said substrate, said pattern of LOCOS being interspersed with exposed regions of said substrate;

etching said exposed regions of said substrate using said pattern of LOCOS regions as a hard mask, creating a pattern of elevated LOCOS regions, creating trenches having inside surfaces in said substrate;

creating a layer of interlayer oxide over said pattern of LOCOS regions and said inside surfaces of said trenches created in said substrate;

depositing a layer of polysilicon over said layer of interlayer oxide;

patterning said layer of polysilicon, said patterned layer of polysilicon comprising at least one contact point over said substrate, completing creation of a electron charge monitoring device having a surface;

providing a semiconductor processing tool, said semiconductor processing tool being designated as being a tool being evaluated for electron charge effect of a process being performed by said tool;

positioning said substrate comprising said electron charge monitoring device inside said processing tool in a location and a position being occupied by a substrate being processed by said tool;

establishing processing conditions of a process as these processing conditions apply for said process and said tool;

exposing said electron charge monitoring device to said established processing conditions for a period of time;

terminating said processing conditions;

removing said electron charge monitoring device from said semiconductor processing tool; and measuring a voltage required to induce a FN tunneling based current between the at least one contact point of said patterned layer of polysilicon and said substrate.

2. The method of claim 1, said creating a pattern of Local Oxidation of Silicon (LOCOS) regions in said substrate comprising the steps of:

depositing a layer of silicon nitride over said substrate;

patterning said layer of silicon nitride, creating a mask of silicon nitride over said substrate, elements of said mask being interspersed with exposed regions of said substrate;

creating layers of Local Oxidation of Silicon (LOCOS) in said exposed regions of said substrate; and removing said mask of silicon nitride from said substrate.

3. The method of claim 1, wherein said layer of interlayer oxide is HTO, dry oxide or wet oxide.

4. The method of claim 1, said layer of interlayer oxide being created to a thickness between about 80 and 300 Angstrom.

5. The method of claim 1, said layer of polysilicon being deposited to a thickness within the range of between 1,500 and 6,000 Angstrom.

6. A method for monitoring electron charge effect occurring during semiconductor processing, comprising:

providing a substrate, a layer of n-type conductivity having been created in said substrate;

creating a pattern of Local Oxidation of Silicon (LOCOS) regions in said substrate, said pattern of LOCOS being interspersed with exposed regions of said substrate;

etching said exposed regions of said substrate using said pattern of LOCOS regions as a hard mask, creating a pattern of elevated LOCOS regions, creating trenches having inside surfaces in said substrate;

creating a layer of interlayer oxide over said pattern of LOCOS regions and said inside surfaces of said trenches created in said substrate;

depositing a layer of polysilicon over said layer of interlayer oxide;

patterning said layer of polysilicon, said patterned layer of polysilicon comprising at least one contact point over said substrate, completing creation of a electron charge monitoring device having a surface;

providing a semiconductor processing tool, said semiconductor processing tool being designated as being a tool being evaluated for electron charge effect of a process being performed by said tool;

positioning said substrate comprising said electron charge monitoring device inside said processing tool in a location and a position being occupied by a substrate being processed by said tool;

establishing processing conditions of a process as these processing conditions apply for said process and said tool;

exposing said electron charge monitoring device to said established processing conditions for a period of time;

terminating said processing conditions;

removing said electron charge monitoring device from said semiconductor processing tool; and measuring a voltage required to induce a FN tunneling based current between the at least one contact point of said patterned layer of polysilicon and said substrate, said patterned layer of polysilicon comprising a square, said pattern of Local Oxidation of Silicon (LOCOS) regions comprising arrays of LOCOS regions perpendicularly and outwardly extending from each side of said square of said patterned layer of polysilicon.

7. The method of claim 1, said current induced between said layer of polysilicon and said substrate being 0.1 $\mu A$.

8. A method for monitoring electron charge effect occurring during semiconductor processing, comprising:

providing a substrate, a layer of n-type conductivity having been created in said substrate;

creating a pattern of Local Oxidation of Silicon (LOCOS) regions in said substrate, said pattern of LOCOS being interspersed with exposed regions of said substrate;

etching said exposed regions of said substrate using said pattern of LOCOS regions as a hard mask, creating a pattern of elevated LOCOS regions, creating trenches having inside surfaces in said substrate;

creating a layer of interlayer oxide over said pattern of LOCOS regions and said inside surfaces of said trenches created in said substrate;

depositing a layer of polysilicon over said layer of interlayer oxide;

patterning said layer of polysilicon, said patterned layer of polysilicon comprising at least one contact point over said substrate; and measuring a voltage required to induce a FN tunneling based current between said at least one contact point of said patterned layer of polysilicon and said substrate after said substrate has been exposed to a semiconductor processing tool under known conditions of processing by said semiconductor processing tool.

9. The method of claim 8, said creating a pattern of Local Oxidation of Silicon (LOCOS) regions in said substrate comprising the steps of:

depositing a layer of silicon nitride over said substrate;

patterning said layer of silicon nitride, creating a mask of silicon nitride over said substrate, elements of said mask being interspersed with exposed regions of said substrate;

creating layers of Local Oxidation of Silicon (LOCOS) in said exposed regions of said substrate; and removing said mask of silicon nitride from said substrate.

10. The method of claim 8, wherein said layer of interlayer oxide is HTO, dry oxide or wet oxide.

11. The method of claim 8, said layer of interlayer oxide being created to a thickness between about 80 and 300 Angstrom.

12. The method of claim 8, said layer of polysilicon being deposited to a thickness within the range of between 1,500 and 6,000 Angstrom.

13. A method of creating an electron charge effect monitoring device, comprising:

providing a substrate, a layer of n-type conductivity having been created in said substrate;

creating a pattern of Local Oxidation of Silicon (LOCOS) regions in said substrate, said pattern of LOCOS being interspersed with exposed regions of said substrate;

etching said exposed regions of said substrate using said pattern of LOCOS regions as a hard mask, creating a pattern of elevated LOCOS regions, creating trenches having inside surfaces in said substrate;

creating a layer of interlayer oxide over said pattern of LOCOS regions and said inside surfaces of said trenches created in said substrate;

depositing a layer of polysilicon over said layer of interlayer oxide;

patterning said layer of polysilicon, said patterned layer of polysilicon comprising at least one contact point over said substrate; and measuring a voltage required to induce a FN tunneling based current between said at least one contact point of said patterned layer of polysilicon and said substrate after said substrate has been exposed to a semiconductor processing tool under known conditions of processing by said semiconductor processing tool, said patterned layer of polysilicon comprising a square, said pattern of Local Oxidation of Silicon (LOCOS) regions comprising arrays of LOCOS regions perpendicularly and outwardly extending from each side of said square of said patterned layer of polysilicon.

14. A method of creating an electron charge effect monitoring device, comprising:

providing a substrate, a layer of n-type conductivity having been created in said substrate;

creating a pattern of Local Oxidation of Silicon (LOCOS) regions in said substrate, said pattern of LOCOS being interspersed with exposed regions of said substrate;

etching said exposed regions of said substrate using said pattern of LOCOS regions as a hard mask, creating a pattern of elevated LOCOS regions, creating trenches having inside surfaces in said substrate;

creating a layer of interlayer oxide over said pattern of LOCOS regions and said inside surfaces of said trenches created in said substrate;

depositing a layer of polysilicon over said layer of interlayer oxide;

patterning said layer of polysilicon, said patterned layer of polysilicon comprising at least one contact point over said substrate; and measuring a voltage required to induce a FN tunneling based current between said at least one contact point of said patterned layer of polysilicon and said substrate after said substrate has been exposed to a semiconductor processing tool under known conditions of processing by said semiconductor processing tool, whereby said electron charge effect monitoring device can be recycled by applying an additional step of thermally annealing said substrate, thereby thermally annealing said electron charge monitoring device having been created in and on said substrate.

15. A method for monitoring electron charge effect occurring during semiconductor processing, comprising:

forming a monitor wafer having floating gate structures;

exposing the monitor wafer to a plasma process; and measuring plasma damage by measuring a voltage required to induce a FN tunneling based current between at least one contact point of said floating gate structures and said monitor wafer.

16. The method of claim 15, said FN tunneling based current between at least one contact point of said floating gate structures and said monitor wafer being about 0.1 $\mu$A.

17. A method for monitoring electron charge effect occurring during semiconductor processing, comprising:

providing a monitor substrate having a layer of n-type conductivity therein and including oxidized regions formed thereover and interspersed with trench regions that each include an opening extending into said monitor substrate, an interlayer oxide layer disposed over said oxidized regions and said trench regions, a patterned polysilicon layer disposed over said interlayer oxide layer and comprising at least one contact point over said monitor substrate that forms an electron charge monitoring device having a surface;

providing a semiconductor processing tool designated as being evaluated for electron charge effect of a process being performed by said semiconductor processing tool;

positioning said monitor substrate inside said semiconductor processing tool in a location and a position generally occupied by a substrate being processed by said semiconductor processing tool;

establishing processing conditions for said process;

exposing said electron charge monitoring device to said established processing conditions for a period of time;

removing said electron charge monitoring device from said semiconductor processing tool; and measuring a voltage required to induce a FN tunneling based current between the at least one contact point of said patterned layer of polysilicon and said monitor substrate.

* * * * *